US011442735B2

(12) United States Patent
Tong et al.

(10) Patent No.: US 11,442,735 B2
(45) Date of Patent: Sep. 13, 2022

(54) SEARCH INSTRUCTION TO ACCESS A TCAM AND MEMORY TO RETURN A PROGRAM COUNTER VALUE FROM THE TCAM

(71) Applicant: HUAWEI TECHNOLOGIES CO., LTD., Guangdong (CN)

(72) Inventors: Xing Tong, Beijing (CN); Hongliang Gao, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/922,457

(22) Filed: Jul. 7, 2020

(65) Prior Publication Data

US 2020/0334040 A1 Oct. 22, 2020

Related U.S. Application Data

(63) Continuation of application No. PCT/CN2019/125296, filed on Dec. 13, 2019.

(30) Foreign Application Priority Data

Dec. 13, 2018 (CN) .......................... 201811526986.0

(51) Int. Cl.
*G06F 9/34* (2018.01)
*G06F 16/953* (2019.01)
(52) U.S. Cl.
CPC .............. *G06F 9/34* (2013.01); *G06F 16/953* (2019.01)

(58) Field of Classification Search
CPC ........................................................ G06F 9/34
See application file for complete search history.

(56) References Cited

U.S. PATENT DOCUMENTS

| 2002/0110122 | A1 | 8/2002 | Ramfelt et al. |
| 2008/0192754 | A1 | 8/2008 | Ku et al. |
| 2011/0292943 | A1* | 12/2011 | Du ...................... H04L 45/7457 370/392 |
| 2012/0159132 | A1 | 6/2012 | Abel et al. |

FOREIGN PATENT DOCUMENTS

| CN | 101267331 A | 9/2008 |
| CN | 101834802 A | 9/2010 |
| CN | 102216909 A | 10/2011 |

(Continued)

OTHER PUBLICATIONS

PCT International Search Report and Written Opinion issued in International Application No. PCT/CN2019/125296 dated Mar. 12, 2020, 12 pages (partial English translation).

(Continued)

*Primary Examiner* — Jacob Petranek
(74) *Attorney, Agent, or Firm* — Fish & Richardson P.C.

(57) ABSTRACT

This application provides an instruction processing method and a chip. The method includes sending, by the thread unit, a search instruction to the search engine unit. The search instruction includes a data address and a first search field, and the thread unit switches from a RUN state to a WAIT state. The method also includes receiving, by the thread unit, data and a program counter that are sent by the search engine unit. The thread unit switches from the WAIT state to the RUN state.

15 Claims, 8 Drawing Sheets

(56) References Cited

FOREIGN PATENT DOCUMENTS

| | | |
|---|---|---|
| CN | 103973571 A | 8/2014 |
| CN | 105791126 A | 7/2016 |
| CN | 107800627 A | 3/2018 |
| CN | 108737278 A | 11/2018 |
| WO | 2018192587 A1 | 10/2018 |
| WO | WO-2019237029 A1 * 12/2019 | ......... G06F 16/9024 |

OTHER PUBLICATIONS

Extended European Search Report issued in European Application No. 19894659.2 dated Feb. 19, 2021, 8 pages.
Office Action issued in Chinese Application No. 201811526986.0 dated Dec. 27, 2021, 21 pages (with English translation).

* cited by examiner

US 11,442,735 B2

SEARCH INSTRUCTION TO ACCESS A TCAM AND MEMORY TO RETURN A PROGRAM COUNTER VALUE FROM THE TCAM

CROSS-REFERENCE TO RELATED APPLICATIONS

This application is a continuation of International Application No. PCT/CN2019/125296, filed on Dec. 13, 2019, which claims priority to Chinese Patent Application No. 201811526986.0, filed on Dec. 13, 2018. The disclosures of the aforementioned applications are hereby incorporated by reference in their entireties.

TECHNICAL FIELD

This application relates to communications technologies, and in particular, to an instruction processing method and a chip.

BACKGROUND

With continuous development of communications technologies, multi-core and multithreaded network processors (NP) have been widely applied to communications devices. A network processor may also be referred to as a chip. The chip includes a thread unit, a search engine unit, a memory unit, and a ternary content addressable memory (TCAM) unit.

In the prior art, in a process in which a thread unit in a chip processes an instruction, the thread unit sends a search instruction to a search engine unit, where the search instruction includes a specific data address. In this case, the thread unit enters a wait (WAIT) state from a run (RUN) state. The search engine unit finds, from a memory unit, data indicated by the specific data address, where the data includes a plurality of fields. Then, the search engine unit returns the obtained data to the thread unit. In this case, the thread unit enters the RUN state from the WAIT state. Then, the thread unit sends, to a TCAM unit, a branch search keyword (key). In this case, the thread unit enters the WAIT state from the RUN state again. The TCAM unit returns a determined program counter corresponding to the key to the thread unit. In this case, the thread unit enters the RUN state from the WAIT state again.

However, in the prior art, in the foregoing process, the thread unit in the chip performs a state switching process twice, and each state switching process results in switching between the RUN state and the WAIT state. Therefore, an instruction processing process of the thread unit is interrupted twice because the thread unit enters the WAIT state. When the thread unit enters the RUN state again, the thread unit needs to repeatedly perform an already performed step. Consequently, the instruction processing process of the thread unit is relatively slow. As a result, core running efficiency of the chip is relatively low, and chip running efficiency is relatively low.

SUMMARY

This application provides an instruction processing method and a chip, to resolve a problem that chip running efficiency is relatively low.

According to a first aspect, this application provides an instruction processing method, applied to a chip, where the chip includes a thread unit and a search engine unit. The method includes:

sending, by the thread unit, a search instruction to the search engine unit, where the search instruction includes a data address and a first search field:

determining, by the search engine unit according to the search instruction, data indicated by the data address and a program counter indicated by the first search field; and sending, by the search engine unit, the data and the program counter to the thread unit.

The thread unit of the chip sends the search instruction to the search engine unit of the chip, where the search instruction includes the data address and the first search field. Then, the thread unit switches from a RUN state to a WAIT state. The search engine unit determines, according to the search instruction, the data indicated by the data address and the program counter indicated by the first search field. The thread unit receives the data and the program counter sent by the search engine unit, and then the thread unit switches from the WAIT state to the RUN state. In the foregoing process, the thread unit needs to initiate the search instruction only once to obtain the data and the program counter required by the thread unit. Therefore, the thread unit switches from the RUN state to the WAIT state only once, thereby reducing a quantity of times the thread unit switches to the WAIT state. In this way, an instruction processing process of the thread unit can be accelerated, and core running efficiency of the chip and running efficiency of the chip can be improved.

In a possible design, the chip further includes a ternary content addressable memory TCAM unit, the TCAM unit is disposed in the search engine unit, and the determining, by the search engine unit according to the search instruction, data indicated by the data address and a program counter indicated by the first search field includes:

determining, by the search engine unit, the data based on the data address;

determining, by the search engine unit, a search keyword based on the data and the first search field:

sending, by the search engine unit, the search keyword and the data to the TCAM unit; and determining, by the TCAM unit, the program counter based on the search keyword.

In a possible design, the chip further includes a ternary content addressable memory TCAM unit, the TCAM unit is connected to the search engine unit, and the determining, by the search engine unit according to the search instruction, data indicated by the data address and a program counter indicated by the first search field includes:

determining, by the search engine unit, the data based on the data address:

determining, by the search engine unit, a search keyword based on the data and the first search field;

sending, by the search engine unit, the search keyword to the TCAM unit; and determining, by the TCAM unit, the program counter based on the search keyword, and sending the program counter to the search engine unit.

In a possible design, the chip further includes a memory unit, and the determining, by the search engine unit, the data based on the data address includes:

sending, by the search engine unit, the data address to the memory unit; and determining, by the memory unit based on the data address, the data indicated by the data address, and sending, to the search engine unit, the data indicated by the data address.

In a possible design, the search instruction further includes a search identifier, the search identifier is used to identify a second search field, and the determining, by the search engine unit, a search keyword based on the data and the first search field includes:

determining, by the search engine unit, the second search field in the data based on the search identifier; and generating, by the search engine unit, the search keyword based on the first search field and the second search field.

In a possible design, the search keyword includes the first search field, a priority of the first search field, the second search field, and a priority of the second search field.

In a possible design, before the sending, by the thread unit, a search instruction to the search engine unit, the method further includes:

obtaining, by the thread unit, a packet, and generating the first search field based on any field in the packet.

In a possible design, the any field is a destination address of the data.

In a possible design, before the sending, by the thread unit, a search instruction to the search engine unit, the method further includes:

obtaining, by the thread unit, a packet, and generating the first search field based on the packet.

According to a second aspect, this application provides a chip. The chip includes a thread unit and a search engine unit, and the thread unit is connected to the search engine unit.

The thread unit is configured to send a search instruction to the search engine unit, where the search instruction includes a data address and a first search field.

The search engine unit is configured to determine, according to the search instruction, data indicated by the data address and a program counter indicated by the first search field, and send the data and the program counter to the thread unit.

The chip is provided, and the chip includes the thread unit and the search engine unit. The thread unit sends the search instruction to the search engine unit, where the search instruction includes the data address and the first search field. Then, the thread unit switches from a RUN state to a WAIT state. The search engine unit determines, according to the search instruction, the data indicated by the data address and the program counter indicated by the first search field. The thread unit receives the data and the program counter sent by the search engine unit, and then the thread unit switches from the WAIT state to the RUN state. In the foregoing process, the thread unit needs to initiate the search instruction only once to obtain the data and the program counter required by the thread unit. Therefore, the thread unit switches from the RUN state to the WAIT state only once, thereby reducing a quantity of times the thread unit switches to the WAIT state. In this way, an instruction processing process of the thread unit can be accelerated, and core running efficiency of the chip and running efficiency of the chip can be improved.

In a possible design, the chip further includes a ternary content addressable memory TCAM unit, and the TCAM unit is disposed in the search engine unit.

The search engine unit includes a request processing module and a result processing module. The request processing module is connected to the result processing module. The TCAM unit includes a receiving module, a determining module, and a sending module. The receiving module and the sending module are separately connected to the determining module.

The request processing module is configured to determine the data based on the data address.

The result processing module is configured to obtain the data, and determine a search keyword based on the data and the first search field.

The receiving module is configured to receive the search keyword and the data that are sent by the result processing module.

The determining module is configured to determine the program counter based on the search keyword.

The sending module is configured to send the data and the program counter to the thread unit.

In a possible design, the chip further includes a ternary content addressable memory TCAM unit, and the TCAM unit is connected to the search engine unit.

The search engine unit includes a request processing module and a result processing module. The request processing module is connected to the result processing module. The TCAM unit includes a receiving module, a determining module, and a sending module. The receiving module and the sending module are separately connected to the determining module.

The request processing module is configured to determine the data based on the data address.

The result processing module is configured to obtain the data, and determine a search keyword based on the data and the first search field.

The receiving module is configured to receive the search keyword sent by the result processing module.

The determining module is configured to determine the program counter based on the search keyword.

The sending module is configured to send the program counter to the result processing module.

The result processing module is further configured to send the data and the program counter to the thread unit.

In a possible design, the chip further includes a memory unit, and the memory unit is separately connected to the request processing module and the result processing module.

The request processing module is configured to send the data address to the memory unit.

The memory unit is configured to determine, based on the data address, the data indicated by the data address, and send, to the result processing module, the data indicated by the data address.

In a possible design, the search instruction further includes a search identifier, and the search identifier is used to identify a second search field. The result processing module is specifically configured to:

determine the second search field in the data based on the search identifier; and generate the search keyword based on the first search field and the second search field.

In a possible design, the search keyword includes the first search field, a priority of the first search field, the second search field, and a priority of the second search field.

In a possible design, the thread unit is further configured to:

obtain a packet before sending the search instruction to the search engine unit, and generate the first search field based on any field in the packet.

In a possible design, the any field is a destination address of the data.

According to a third aspect, this application provides an instruction processing device, including at least one chip for performing any one of the methods according to the first aspect.

According to a fourth aspect, this application provides a computer storage medium, where the computer storage medium includes an instruction, and when the instruction runs on a computer, the computer is enabled to perform the method according to the first aspect.

According to a fifth aspect, this application provides a computer program product including an instruction, where when the computer program product including the instruction runs on a computer, the computer is enabled to perform the method according to the first aspect.

DESCRIPTION OF EMBODIMENTS

Figure 1:
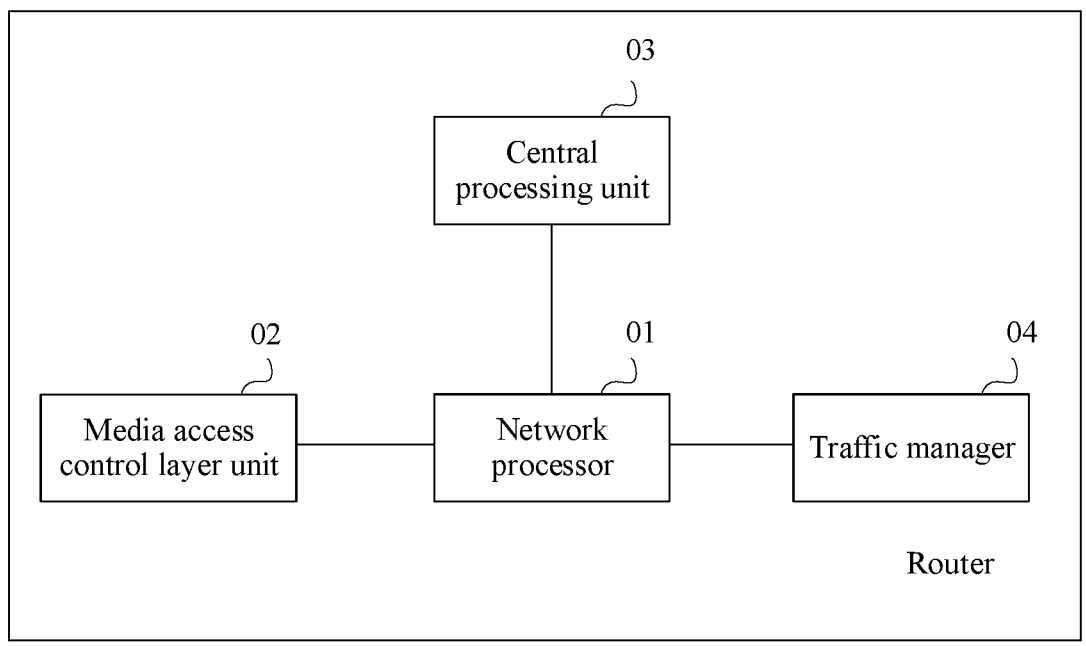
FIG. 1 is a schematic diagram of a structure of a router according to an embodiment of this application.

The embodiments of this application may be applied to a chip or any device that can perform the embodiments of this application. The following describes some terms in this application, to facilitate understanding by a person skilled in the art. It should be noted that when the solutions in the embodiments of this application are applied to a chip or any device that can perform the embodiments of this application, names of units and modules may change, but this does not affect implementation of the solutions in the embodiments of this application.

It should be understood that a chip provided in technical solutions in the embodiments of this application may be applied to various communication systems. The communications systems may be, for example, a wireless local area network communications (WLAN) system, a global system for mobile communications (GSM) system, a code division multiple access (CDMA) system, a wideband code division multiple access (WCDMA) system, a general packet radio service (GPRS), a long term evolution (LTE) system, an LTE frequency division duplex (FDD) system, an LTE time division duplex (TDD) system, a universal mobile telecommunications system (UMTS), a worldwide interoperability for microwave access (WiMAX) communications system, a future fifth-generation mobile communications technology (5G) system, or another system that may appear in the future.

Terms used in implementations of this application are merely used to explain specific embodiments of this application, but are not intended to limit this application. In the following, some terms in this application are described to help a person skilled in the art have a better understanding.

(1) Core: A network processor (NP) may have a plurality of cores. The plurality of cores may concurrently execute respective instructions.

(2) Thread: A plurality of threads may be configured for one core, and only one thread can execute an instruction at a same time in one core, that is, only one thread can be in a run (RUN) state at a same time in one core.

(3) Program counter (PC): A program counter is configured to indicate a location of a computer in an instruction sequence of the computer.

(4) TCAM: A TCAM is mainly configured to quickly search for a program counter.

(5) "A plurality of" means two or more, and another quantifier is similar to this. The term "and/or" describes an association relationship for describing associated objects and represents that three relationships may exist. For example, A and/or B may represent the following three cases: Only A exists, both A and B exist, and only B exists. The character "/" generally indicates an "or" relationship between the associated objects.

(6) "Correspondence" may refer to an association or a binding relationship, and that A corresponds to B refers to that there is an association or a binding relationship between A and B.

It should be noted that nouns or terms used in the embodiments of this application may be mutually referenced, and details are not described again.

A multi-core and multithreaded chip is an important component of a network device, and in particular, a multi-core and multithreaded chip is a core component of a forwarding plane of a data communications device. With the development of chips, a data throughput of a chip becomes increasingly high. For example, a data throughput of a chip increases from 100 gigabits per second (Gbps) to 1 terabit per second (Tbps). As can be learned, the throughput of the chip increases by 10 times. As a data throughput of a chip becomes increasingly high, to ensure thread processing performance, a quantity of cores of the chip needs to be increased. However, an increase in the quantity of the cores of the chip causes a relatively large area and relatively high power consumption of the chip. If packet processing efficiency of a core can be improved, a quantity of processing cores can be reduced.

One chip includes a plurality of cores, and the plurality of cores may concurrently execute respective instructions. A core may have a plurality of threads. When processing a thread, a core sequentially executes instructions.

Generally, an execution process of an instruction is divided into a plurality of stages, for example, divided into the following six stages: an instruction feeding stage, an instruction decoding stage, a register reading stage, a data selection stage, an execution stage, and a write-back stage. Execution of each stage requires one clock cycle. When a thread fetches an instruction, the thread sequentially fetches a plurality of instructions with consecutive addresses, for example, reads four consecutive instructions, and then the thread performs pipeline processing on the instructions.

When a thread processes an instruction, there are the following states:

Halt (HALT) state: When a thread is started, the thread is in the halt state by default. A chip can switch the thread from the halt state to a run (RUN) state.

Run state: When a thread executes an instruction, the thread is in the RUN state. The thread switches from the RUN state to a wait (WAIT) state in the following cases: In a first case, the thread executes a jump instruction. In this case, the thread automatically jumps to the WAIT state. After jumping to a destination program counter, the thread returns to the RUN state again. In a second case, the thread initiates a memory access instruction, or TCAM access waits for a result to be returned. In this case, the thread enters the WAIT state. Then, after the result is returned, the thread returns to the RUN state again.

WAIT state: When a thread waits for a memory access result to be returned or a thread waits for a destination program counter, the thread is in the WAIT state.

Wait for a new packet to enter WAIT_NPKT state: When a thread waits for a new packet, the thread is in the WAIT_NPKT state. After a thread completes processing of a packet, the thread enters the WAIT_NPKT state from the RUN state.

When a jump instruction, memory access, or TCAM search needs to be performed, a thread needs to wait, that is, the thread switches from the RUN state to another state. In this case, an instruction pipeline is interrupted. Then, when recovering to the RUN state, the thread needs to obtain an instruction again. Consequently, an instruction processing process of the thread is slowed down. When the instruction pipeline is interrupted for a larger quantity of time, instruction execution efficiency is lower, and chip running efficiency is reduced.

A chip includes four circuit units: a thread unit, a TCAM unit, a search engine unit, and a memory unit. The memory unit includes a memory inside the chip and a memory outside the chip. For example, the memory outside the chip is a memory module.

In a process in which a thread unit processes an instruction, the thread unit sends a search instruction to a search engine unit, where the search instruction includes a specific data address. In this case, the thread unit enters a WAIT state from a RUN state. The search engine unit finds, from a memory unit, data indicated by the specific data address, where the data includes a plurality of fields. Then, the search engine unit returns the obtained data to the thread unit. In this case, the thread unit enters the RUN state from the WAIT state. It can be learned that the search engine unit performs interface conversion between the memory unit and the thread unit, and the search engine unit is actually a channel. Then, the thread unit sends, to a TCAM unit, a branch search key. In this case, the thread unit enters the WAIT state from the RUN state again. The TCAM unit returns a determined program counter corresponding to the key to the thread unit. In this case, the thread unit enters the RUN state from the WAIT state again.

For example, the thread unit extracts a destination internet protocol (IP) address from a packet header of a packet, and then assigns the destination IP address to a field D. In this case, the thread unit is in the RUN state. The thread unit sends a search instruction to the search engine unit. The search instruction includes a specific data address, the search instruction is used to instruct to search for a table 1, and an index of the table 1 is 2. In this case, because the thread unit needs to wait for the search engine unit to return the table 1, and there is a delay in waiting for the result to be returned, the thread unit enters the WAIT state from the RUN state. The search engine unit finds, from the memory unit, the table 1 indicated by the specific data address, where the table 1 includes a field A, a field B, and a field C. The search engine unit returns the table 1 to the thread unit. In this case, the thread unit enters the RUN state from the WAIT state. Then, the thread unit sends a switch-case instruction to the TCAM unit, where the switch-case instruction includes a branch search key. In this case, because the TCAM unit needs to obtain corresponding program counters based on the fields A, B, C, and D, there is also a delay in searching by the TCAM unit. Therefore, the thread unit enters the WAIT state from the RUN state again. The TCAM unit may determine that a program counter corresponding to the field A is PC1, a program counter corresponding to the field B is PC2, a program counter corresponding to the field C is PC3, and a program counter corresponding to the field D is PC4. Therefore, the TCAM unit determines, based on the foregoing content, the program counters corresponding to the key. Then, the TCAM unit returns the determined program counters corresponding to the key to the thread unit. In this case, the thread unit enters the RUN state from the WAIT state again. As can be learned from the foregoing example, the thread unit switches from the RUN state to the WAIT state twice. When the thread unit is interrupted and enters the RUN state again, the thread unit needs to repeatedly obtain some instructions. Therefore, the thread unit needs to repeatedly perform some already performed steps. Consequently, core running efficiency of the chip is relatively low.

The following describes technical solutions of embodiments in this application with reference to accompanying drawings.

A method provided in this application may be applied to a chip, a processor, or a central processing unit. This is not limited in this application. For example, when the method provided in this application is applied to a chip, the chip may complete data search and branch search. For another example, when the chip provided in this application is applied to another data communications device, a forwarding engine application specific integrated circuit (ASIC) in the data communications device may also complete data search and branch search by using the method provided in this application.

The chip provided in this application may be applied to a router, a terminal, or a server. This is not limited in this application. For example, when the chip provided in this application is applied to a router, the chip may be used as a forwarding plane of the router, and thus the chip is responsible for fast forwarding processing of a data packet.

FIG. 1 is a schematic diagram of a structure of a router according to an embodiment of this application. The router shown in FIG. 1 includes a network processor 01, a media access control (MAC) layer unit 02, a central processing unit (CPU) 03, and a traffic manager (TM) 04. The network processor 01 is the chip in this application. The MAC layer unit 02, the CPU 03, and the TM 04 are separately connected to the network processor 01.

Figure 2:
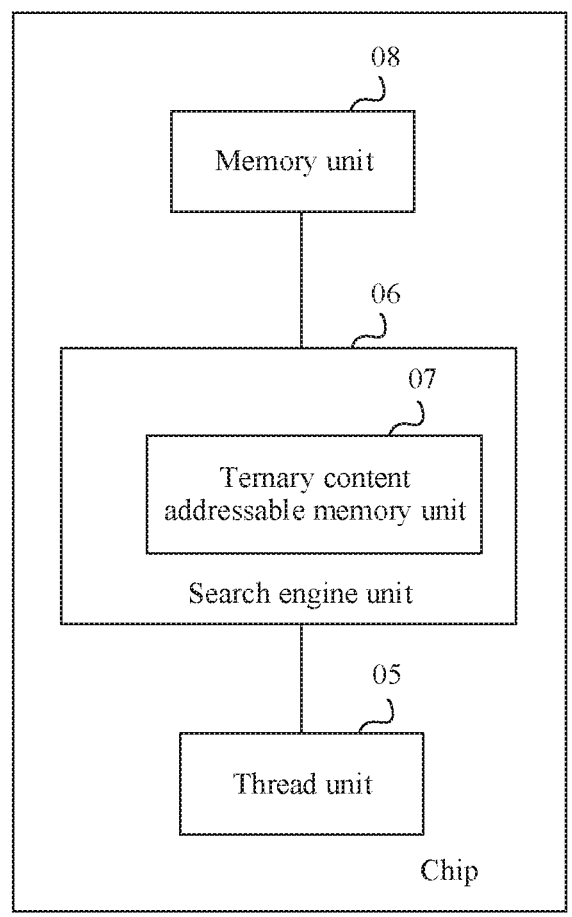
FIG. 2 is a schematic diagram of a structure of a chip according to an embodiment of this application.
Figure 3:
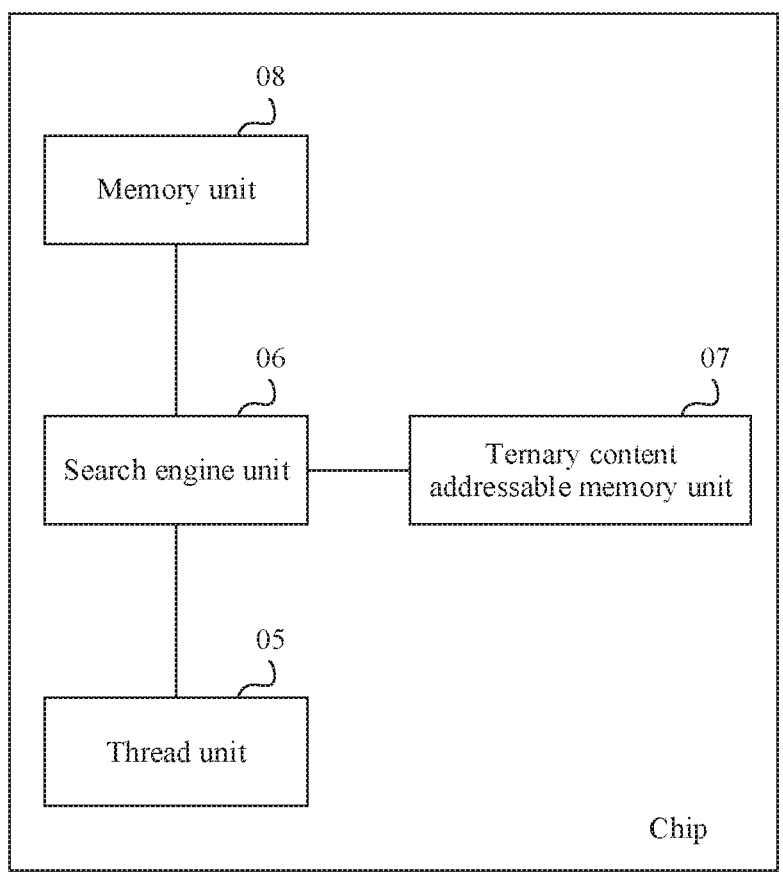
FIG. 3 is a schematic diagram of a structure of another chip according to an embodiment of this application.

FIG. 2 is a schematic diagram of a structure of a chip according to an embodiment of this application. FIG. 3 is a schematic diagram of a structure of another chip according to an embodiment of this application. As shown in FIG. 2 and FIG. 3, the chip mainly includes a thread unit 05, a search engine unit 06, a TCAM unit 07, and a memory unit 08. As shown in FIG. 2, the thread unit 05 is connected to the search engine unit 06, the search engine unit 06 is connected to the memory unit 08, and the memory unit 08 is disposed in the TCAM unit 07. Alternatively, as shown in FIG. 3, the thread unit 05 is connected to the search engine unit 06, the search engine unit 06 is connected to the memory unit 08, and the search engine unit 06 is connected to the TCAM unit 07. The search engine unit 06 may be an intelligent search engine.

Figure 4:
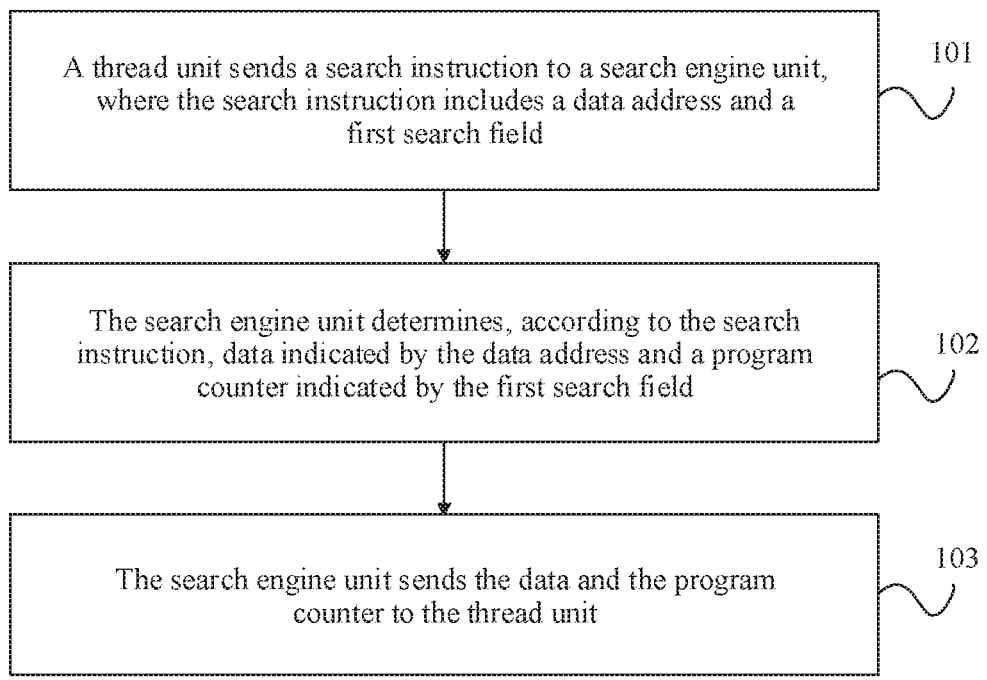
FIG. 4 is a schematic flowchart of an instruction processing method according to an embodiment of this application.

FIG. 4 is a schematic flowchart of an instruction processing method according to an embodiment of this application. The method is applied to a chip, and the chip includes a thread unit and a search engine unit. As shown in FIG. 4, the method includes the following steps.

101: The thread unit sends a search instruction to the search engine unit, where the search instruction includes a data address and a first search field.

For example, the thread unit of the chip generates a search instruction, where the search instruction includes the data address and the first search field. The data address may indicate data that needs to be searched for by the thread unit, and the first search field is used to indicate a program counter that needs to be obtained by the thread unit. Then, the thread unit sends the search instruction to the search engine unit. In this case, the thread unit enters a WAIT state from a RUN state.

102: The search engine unit determines, according to the search instruction, data indicated by the data address and a program counter indicated by the first search field.

For example, the search engine unit receives the search instruction sent by the thread unit, and then the search engine unit may determine the data indicated by the data address, and the search engine unit may determine the program counter indicated by the first search field.

103: The search engine unit sends the data and the program counter to the thread unit.

For example, the search engine unit sends the found data and program counters to the thread unit. After receiving the data and the program counter returned by the search engine unit, the thread unit enters the RUN state from the WAIT state.

In this embodiment, the thread unit of the chip sends the search instruction to the search engine unit of the chip, where the search instruction includes the data address and the first search field. Then, the thread unit switches from a RUN state to a WAIT state. The search engine unit determines, according to the search instruction, the data indicated by the data address and the program counter indicated by the first search field. The thread unit receives the data and the program counter sent by the search engine unit, and then the thread unit switches from the WAIT state to the RUN state. In the foregoing process, the thread unit needs to initiate the search instruction only once to obtain the data and the program counter required by the thread unit. Therefore, the thread unit switches from the RUN state to the WAIT state only once, thereby reducing a quantity of times the thread unit switches to the WAIT state. In this way, an instruction processing process of the thread unit can be accelerated, and core running efficiency of the chip and running efficiency of the chip can be improved.

Figure 5:
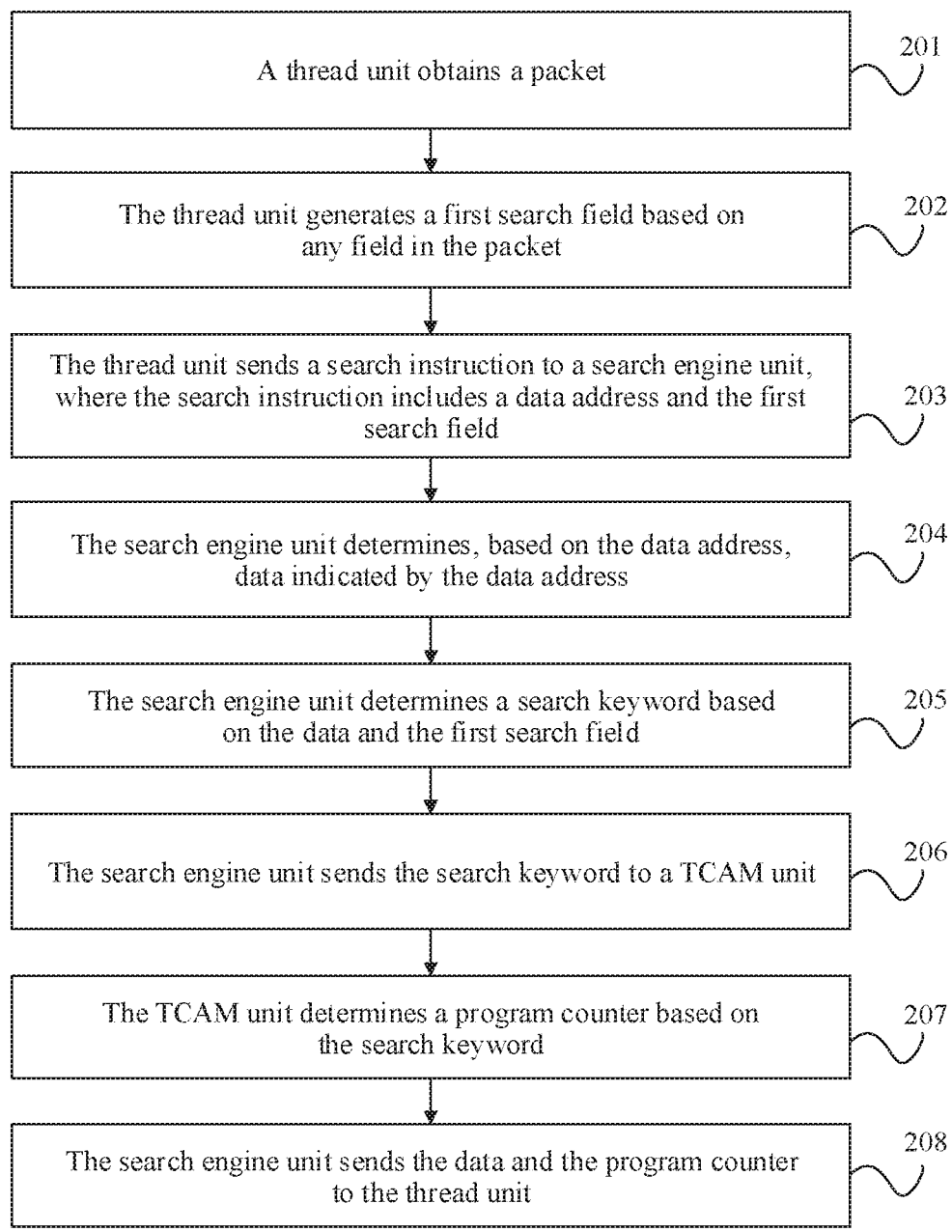
FIG. 5 is a schematic flowchart of another instruction processing method according to an embodiment of this application.

FIG. 5 is a schematic flowchart of another instruction processing method according to an embodiment of this application. The method is applied to a chip, and the chip includes a thread unit, a search engine unit, a TCAM unit, and a memory unit. As shown in FIG. 5, the method includes the following steps.

201: The thread unit obtains a packet.

For example, the thread unit obtains the packet. For example, a central processing unit sends the packet to the thread unit in the chip. The packet to be processed includes a destination address of data.

202: The thread unit generates a first search field based on any field in the packet.

For example, the thread unit generates a first search field based on any field in the packet. Optionally, the thread unit generates the first search field based on the destination address of the data in the packet.

For example, the central processing unit sends the packet to the thread unit. The thread unit extracts a destination IP address from a packet header of the packet, and then the thread unit assigns the destination IP address to a field.

203: The thread unit sends a search instruction to the search engine unit, where the search instruction includes a data address and the first search field.

Optionally, the search instruction further includes a search identifier, and the search identifier is used to identify a second search field.

For example, the thread unit generates a search instruction based on the data address of the to-be-searched data and the first search field. Then, the thread unit sends the search instruction to the search engine unit of the chip.

Optionally, the search identifier (profile ID) is preconfigured for the thread unit, and the search identifier is used to identify the second search field. Therefore, the thread unit places the data address, the first search field, and the search identifier in the search instruction.

204: The search engine unit determines, based on the data address, the data indicated by the data address.

Optionally, step 204 specifically includes:

step 2041 (not shown in FIG. 5): The search engine unit sends the data address to the memory unit.

step 2042 (not shown in FIG. 5): The memory unit determines, based on the data address, the data indicated by the data address, and sends, to the search engine unit, the data indicated by the data address.

For example, the search engine unit first needs to determine the data indicated by the data address. Specifically, the search engine unit includes a request processing module and a result processing module. The request processing module of the search engine unit sends the data address to the memory unit of the chip, and the request processing module sends the first search field and the search identifier to the result processing module of the search engine unit. The memory unit determines the data indicated by the data address, and then the memory unit sends, to the result processing module of the search engine unit, the data indicated by the data address.

205: The search engine unit determines a search keyword based on the data and the first search field.

Optionally, step 205 specifically includes:

step 2051 (not shown in FIG. 5): The search engine unit determines the second search field in the data based on the search identifier.

step 2052 (not shown in FIG. 5): The search engine unit generates the search keyword based on the first search field and the second search field.

Optionally, the search keyword includes the first search field, a priority of the first search field, the second search field, and a priority of the second search field.

For example, the search engine unit needs to generate a keyword used to search for a program counter. Specifically, the request processing module sends the first search field and the search identifier to the result processing module of the search engine unit, and the result processing module receives the data returned by the memory unit, where the data includes a plurality of fields. Therefore, it can be learned that there are many fields in the data returned by the memory unit. However, because the TCAM unit may use only one or more of the fields to perform branch search, the result processing module needs to determine these fields that need to be reserved. Therefore, the result processing module may determine, based on the search identifier, a field that needs to be reserved, and further remove a field that does not need to be reserved. In this case, the result processing module determines the second search field indicated by the search identifier, where the second search field is a field that needs to be reserved. Then, the result processing module generates the search keyword based on the first search field and the second search field. Therefore, the result processing module obtains a branch search field. In addition, each search field includes a corresponding priority.

206: The search engine unit sends the search keyword to the TCAM unit.

For example, as shown in FIG. 2, the TCAM unit is disposed in the search engine unit, and the result processing module of the search engine unit sends the search keyword and the data together to the TCAM unit.

Alternatively, in this embodiment, as shown in FIG. 3, a TCAM unit in the prior art is reused as the TCAM unit, the search engine unit is connected to the TCAM unit, and the result processing module of the search engine unit sends the search keyword to the TCAM unit.

207: The TCAM unit determines a program counter based on the search keyword.

For example, a compiler of the TCAM unit delivers a specific TCAM entry, and the compiler parses a microcode program to obtain a specific PC corresponding to the search keyword. To be specific, an input of the TCAM unit is a key, and an output of the TCAM unit is a PC.

In this embodiment, as shown in FIG. 2, the TCAM unit is disposed in the search engine unit, so that after the result processing module of the search engine unit sends the search keyword to the TCAM unit, the TCAM unit may determine the program counter, and then the search engine unit determines the program counter.

Alternatively, in this embodiment, as shown in FIG. 3, a TCAM unit in the prior art is reused as the TCAM unit, and the search engine unit is connected to the TCAM unit. Therefore, after the result processing module of the search engine unit sends the search keyword to the TCAM unit, the TCAM unit may determine the program counter. Then, the TCAM unit sends the program counter to the result processing module of the search engine unit.

For example, the TCAM unit may execute the following code: Switch{case(A==condition A), PC1: execution code 1; case(B=condition B), PC2: execution code 2; case (C=condition C), PC3: execution code 3; case (D==condition D), PC4: execution code 4:}. A program counter corresponding to the condition A is PC1, and corresponds to the execution code 1. A program counter corresponding to the condition B is PC2, and corresponds to the execution code 2. A program counter corresponding to the condition C is PC3, and corresponds to the execution code 3. A program counter corresponding to the condition D is PC4, and corresponds to the execution code 4. It can be learned that TCAM content whose condition A is a key is PC1, TCAM content whose condition B is a key is PC2, TCAM content whose condition C is a key is PC3, and TCAM content whose condition D is a key is PC4. If a value of content in the data found and returned by the memory unit is exactly the condition B, the program counter determined by the TCAM unit is PC2.

208: The search engine unit sends the data and the program counter to the thread unit.

For example, as shown in FIG. 2, the TCAM unit is disposed in the search engine unit. After the result processing module of the search engine unit receives the data returned by the memory unit, the result processing module sends the data to the TCAM unit. In addition, the TCAM unit determines the program counter. Therefore, the TCAM unit in the search engine unit may send the data and the program counter to the thread unit.

Alternatively, as shown in FIG. 3, a TCAM unit in the prior art is reused as the TCAM unit, the search engine unit is connected to the TCAM unit, the result processing module of the search engine unit receives data returned by the memory unit, and the result processing module receives the program counter returned by the TCAM unit. Therefore, the result processing module of the search engine unit may send the data and the program counter to the thread unit.

Alternatively, as shown in FIG. 3, a TCAM unit in the prior art is reused as the TCAM unit, the search engine unit is connected to the TCAM unit, the result processing module of the search engine unit receives the data returned by the memory unit, and the result processing module of the search engine unit may send the data to the thread unit. In addition, the TCAM unit determines the program counter, and the TCAM unit may send the program counter to the thread unit.

For example, if the value of the content in the data found and returned by the memory unit is exactly the condition B, where the program counter corresponding to the condition B is PC2, the program counter determined by the TCAM unit is PC2. The thread unit executes an instruction corresponding to PC2.

For example, the thread unit extracts the destination IP address from the packet header of the packet, and then assigns the destination IP address to a field D. The thread unit needs to obtain data in a table 1, and the thread unit needs to obtain a field A, a field B, and a field C from the table 1, and add the field D as a branch search field. The central processing unit sends a search identifier profile ID 1 to the thread unit. The thread unit converts an entry whose index is 2 in the table 1 into a specific physical address. Specifically, the thread unit obtains the physical address through calculation based on the identifier 1 and the index 2 in the table 1. Then, the thread unit adds the specific physical address, the profile ID 1, and a value of the field D to the search instruction. The thread unit sends the search instruction to the search engine unit. After sending the search instruction, the thread unit switches from the RUN state to the WAIT state.

Figure 6:
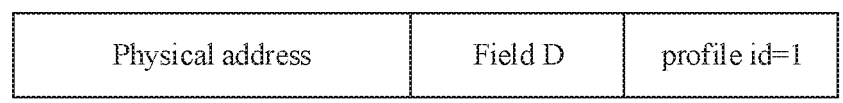
FIG. 6 is a schematic diagram of a format of a search instruction according to an embodiment of this application.

FIG. 6 is a schematic diagram of a format of a search instruction according to an embodiment of this application. A specific format of the search instruction is shown in FIG. 6. Then, the request processing module of the search engine unit extracts the field D and the search identifier from the search instruction, and the request processing module sends the field D and the search identifier to the result processing module of the search engine unit. The request processing module extracts the physical address from the search instruction, and the request processing module sends the physical address to the memory unit. The memory unit determines data indicated by the physical address, where the data includes the field A, the field B, the field C, a field E, and a field F. The memory unit sends the data to the result processing module of the search engine unit. The result processing module of the search engine unit determines, based on the profile ID 1, that the field A, the field B, and the field C need to be reserved. Then, the result processing module constructs the search keyword key based on the field A, the field B, the field C, and the field D. The result processing module sends a branch search instruction to the TCAM unit, where the branch search instruction includes the key.

Figure 7:
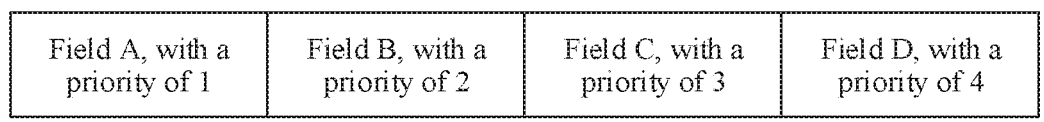
FIG. 7 is a schematic diagram of a format of a branch search instruction according to an embodiment of this application.

FIG. 7 is a schematic diagram of a format of a branch search instruction according to an embodiment of this application. A specific format of the branch search instruction is shown in FIG. 7. A condition sequence of a statement of the branch search instruction is sequentially the field A, the field B, the field C, and the field D. A priority of the field A is 1, a priority of the field B is 2, a priority of the field C is 3, and a priority of the field D is 4. Therefore, the TCAM unit first searches the table by using the field A, and if there is no hit, searches the table by using the field B, and so on. For example, there is a hit if the value of the field A is the condition A, or there is a miss if the value of the field A is not the condition A, where the condition A is 0 or 1. Therefore, the TCAM unit obtains the program counter. In the chip structure shown in FIG. 2, the TCAM unit is disposed in the search engine unit. The result processing module of the search engine unit sends the field A, the field B, and the field C to the TCAM unit. Because the TCAM unit determines the program counter, the TCAM unit returns the program counter, the field A, the field B, and the field C to the thread unit together. Then, the thread unit switches from the WAIT state to the RUN state, and the thread unit executes an instruction corresponding to the program counter.

In this embodiment, the thread unit of the chip sends the search instruction to the search engine unit of the chip, where the search instruction includes the data address, the first search field, and the search identifier, and the search identifier is used to identify the second search field. Then, the thread unit switches from the RUN state to the WAIT state. The search engine unit determines, according to the search instruction, the data indicated by the data address. In addition, the search engine unit generates the search keyword, and the search engine unit sends the branch search instruction to the TCAM unit to search for the program counter, where the branch search instruction includes the search keyword. Then, the search engine unit returns the determined data and program counter to the thread unit. After receiving the data and the program counter sent by the search engine unit, the thread unit switches from the WAIT state to the RUN state, and the thread unit executes the instruction corresponding to the program counter. In the foregoing process, because the thread unit needs to initiate only one search instruction to obtain the data and the program counter required by the thread unit, the thread unit switches from the RUN state to the WAIT state only once. To be specific, the thread unit needs to switch from the RUN state to the WAIT state only once to complete the data search and the branch search. Therefore, this reduces a quantity of times the thread unit is switched to the WAIT state, and reduces a quantity of times an instruction processing process of the thread unit is interrupted, and the thread unit does not need to repeatedly perform an already performed step for a plurality of times. Therefore, the instruction processing process of the thread unit can be accelerated, instruction processing efficiency is improved, and core running efficiency of the chip and running efficiency of the chip are accelerated. In addition, the search engine unit determines a field that needs to be reserved in the data.

The instruction processing methods according to the embodiments of this application are described in detail above, and network chips of the embodiments of this application are described below.

Figure 8:
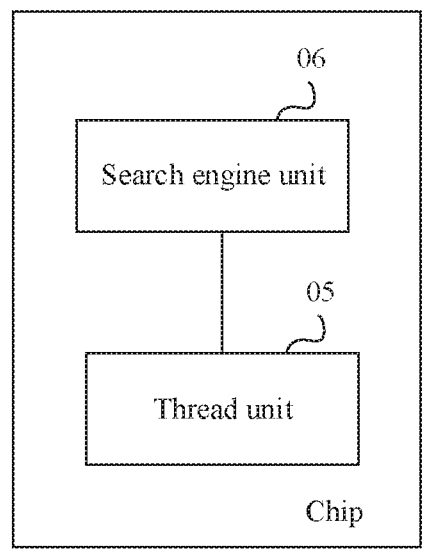
FIG. 8 is a schematic block diagram of a chip according to an embodiment of this application.

In an example, FIG. 8 is a schematic block diagram of a chip according to an embodiment of this application. As shown in FIG. 8, the chip includes a thread unit 05 and a search engine unit 06. The thread unit 05 is connected to the search engine unit 06.

The thread unit 05 is configured to send a search instruction to the search engine unit 06, where the search instruction includes a data address and a first search field.

The search engine unit 06 is configured to determine, according to the search instruction, data indicated by the data address and a program counter indicated by the first search field, and send the data and the program counter to the thread unit 05.

The thread unit 05 may perform the step 101 of the method shown in FIG. 4, and the search engine unit 06 may perform the step 102 of the method shown in FIG. 4.

The chip in the embodiment shown in FIG. 8 may be configured to execute the technical solution in the embodiment shown in FIG. 4 in the foregoing method. Implementation principles and technical effects of the chip are similar, and details are not described herein again.

In this embodiment, the chip is provided, and the chip includes the thread unit and the search engine unit. The thread unit sends the search instruction to the search engine unit, where the search instruction includes the data address and the first search field. Then, the thread unit switches from a RUN state to a WAIT state. The search engine unit determines, according to the search instruction, the data indicated by the data address and the program counter indicated by the first search field. The thread unit receives the data and the program counter that are sent by the search engine unit, and then the thread unit switches from the WAIT state to the RUN state. In the foregoing process, the thread unit needs to initiate the search instruction only once to obtain the data and the program counter required by the thread unit. Therefore, the thread unit switches from the RUN state to the WAIT state only once, thereby reducing a quantity of times the thread unit switches to the WAIT state. In this way, an instruction processing process of the thread unit can be accelerated, and core running efficiency of the chip and running efficiency of the chip can be improved.

Figure 9:
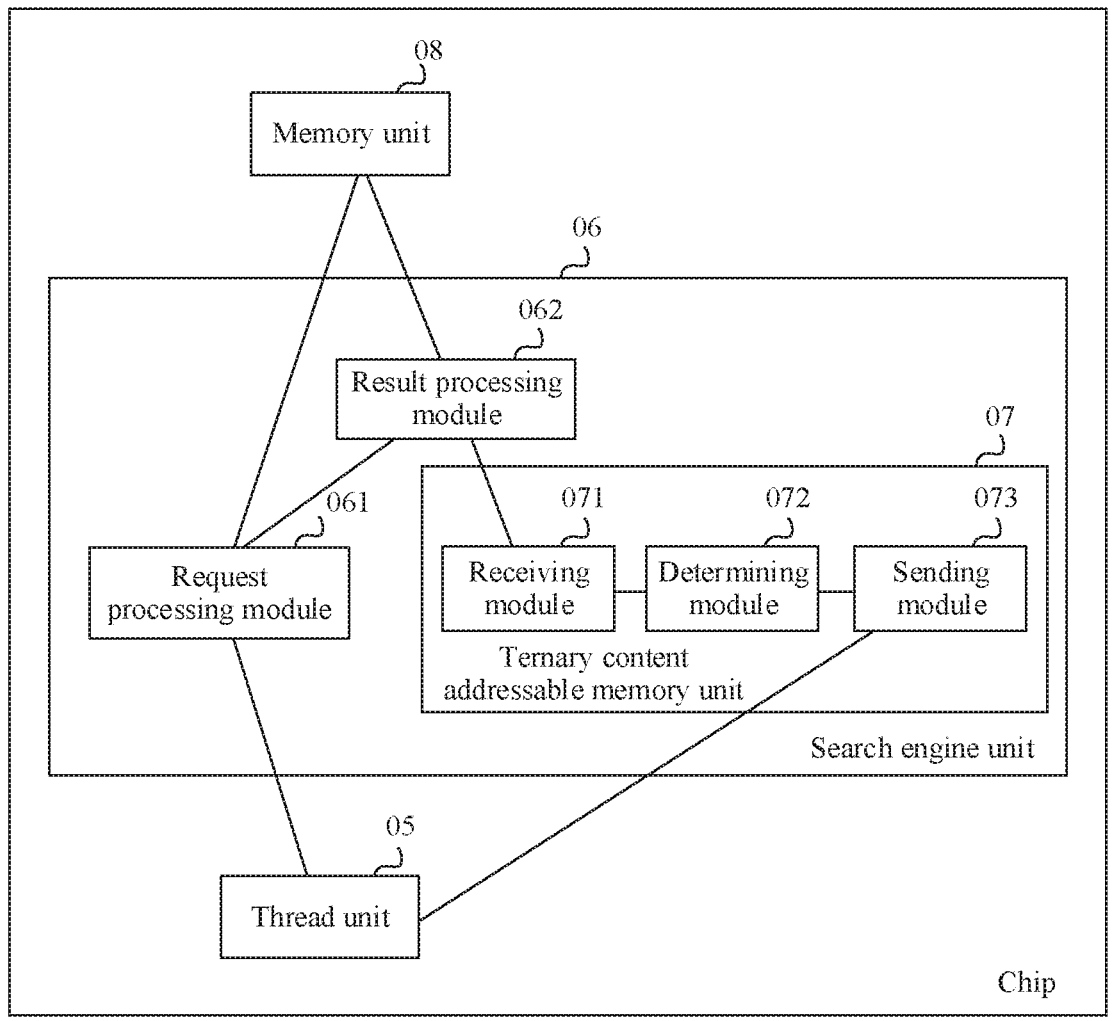
FIG. 9 is a schematic block diagram of a chip according to an embodiment of this application.
Figure 10:
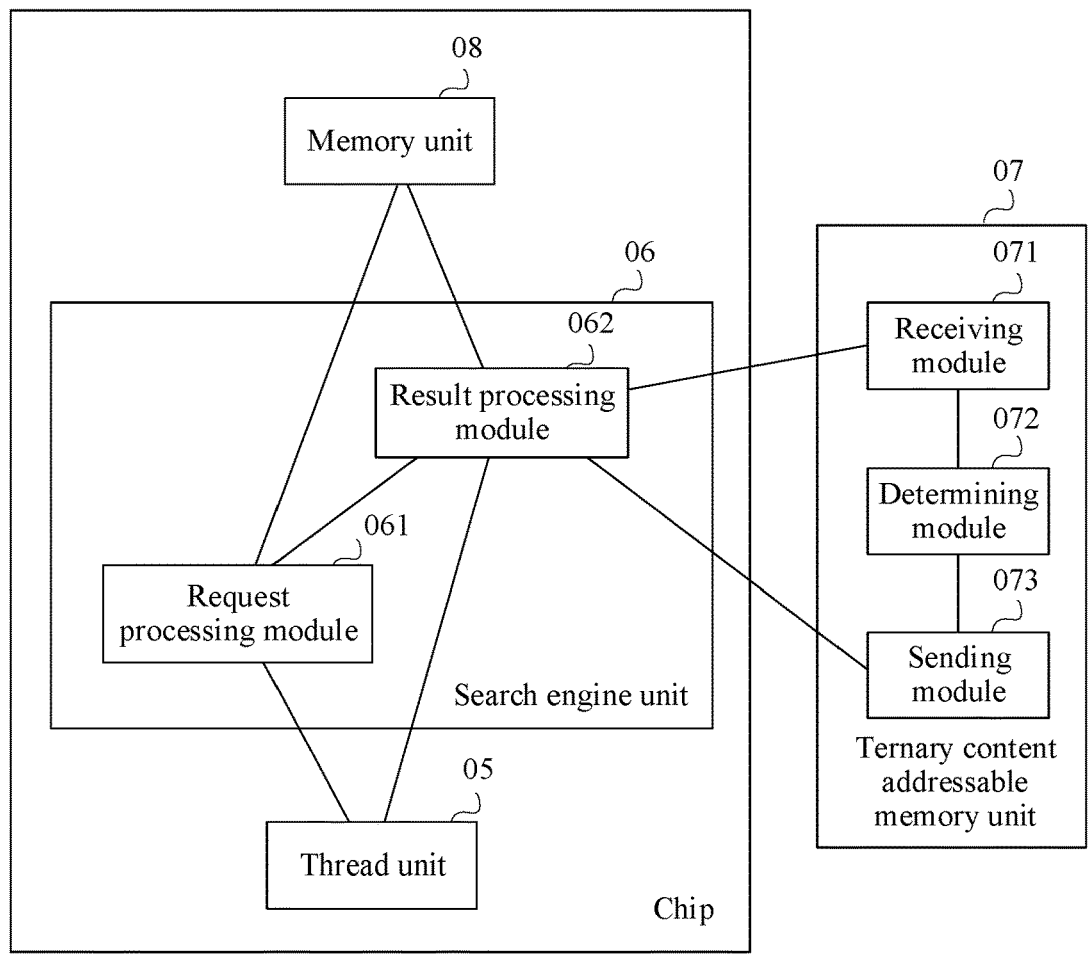
FIG. 10 is a schematic block diagram of another chip according to an embodiment of this application.

In an example, FIG. 9 is a schematic block diagram of a chip according to an embodiment of this application, and FIG. 10 is a schematic block diagram of another chip according to an embodiment of this application. As shown in FIG. 9 and FIG. 10, based on the chip shown in FIG. 8, the chip further includes a TCAM unit 07. The search engine unit 06 includes a request processing module 061 and a result processing module 062, where the request processing module 061 is connected to the result processing module 062.

As shown in FIG. 9, the TCAM unit 07 includes a receiving module 071, a determining module 072, and a sending module 073. The receiving module 071 and the sending module 073 are separately connected to the determining module 072. The receiving module 071 is connected to the result processing module 062. The sending module 073 is connected to the thread unit 05. The TCAM unit 07 is disposed in the search engine unit 06, and the modules in the search engine unit 06 and the TCAM unit 07 perform the following process:

The request processing module 061 is configured to determine the data based on the data address. The request processing module 061 may perform the step 204 in the method shown in FIG. 5.

The result processing module 062 is configured to obtain the data, determine the search keyword based on the data and the first search field, and send the search keyword and the data to the TCAM unit 07. The result processing module 062 may perform steps 205 and 206 in the method shown in FIG. 5.

The receiving module 071 is configured to receive the search keyword and the data that are sent by the result processing module 062.

The determining module 072 is configured to determine the program counter based on the search keyword. The determining module 072 may perform the step 207 in the method shown in FIG. 5.

The sending module 073 is configured to send the data and the program counter to the thread unit 05.

Alternatively, as shown in FIG. 10, the TCAM unit 07 includes a receiving module 071, a determining module 072, and a sending module 073. The receiving module 071 and the sending module 073 are separately connected to the determining module 072. The TCAM unit 07 is connected to the search engine unit 06. The receiving module 071 and the sending module 073 are separately connected to the result processing module 062. The modules in the search engine unit 06 and the TCAM unit 07 perform the following process:

The request processing module 061 is configured to determine data based on the data address. The request processing module 061 may perform the step 204 in the method shown in FIG. 5.

The result processing module 062 is configured to obtain the data, determine the search keyword based on the data and the first search field, and send the search keyword to the TCAM unit 07. The result processing module 062 may perform steps 205 and 206 in the method shown in FIG. 5.

The receiving module 071 is configured to receive the search keyword sent by the result processing module 062.

The determining module 072 is configured to determine the program counter based on the search keyword. The determining module 072 may perform the step 207 in the method shown in FIG. 5.

The sending module 073 is configured to send the program counter to the result processing module 062. The sending module 073 may perform the step 207 in the method shown in FIG. 5. The result processing module 062 is further configured to send the data and the program counter to the thread unit 05.

Optionally, the chip further includes a memory unit 08, and the memory unit 08 is connected to the request processing module 061 and the result processing module 062.

The request processing module 061 is configured to send the data address to the memory unit 08. The request processing module 061 may perform the step 2041 in the method, previously described with reference to FIG. 5.

The memory unit 08 is configured to determine, based on the data address, the data indicated by the data address, and send, to the result processing module 062, the data indicated by the data address. The memory unit 08 may perform the step 2042 in the method, previously described with reference to FIG. 5.

Optionally, the search instruction further includes a search identifier, and the search identifier is used to identify a second search field. The result processing module 062 is specifically configured to determine the second search field in the data based on the search identifier, and generate the search keyword based on the first search field and the second search field. The result processing module 062 may perform the step 205 in the method shown in FIG. 5.

The search keyword includes the first search field, a priority of the first search field, the second search field, and a priority of the second search field.

Optionally, the thread unit 05 is further configured to obtain a packet before sending the search instruction to the search engine unit 06, and generate the first search field based on any field in the packet. Optionally, the any field is a destination address of the data. The thread unit 05 may perform steps 201 and 202 in the method shown in FIG. 5.

The chip in the embodiments shown in FIG. 9 and FIG. 10 may be configured to execute the technical solution in the embodiment shown in FIG. 5 in the foregoing method. Implementation principles and technical effects of the chip are similar, and details are not described herein again.

In addition, implementation of the embodiments shown in FIG. 9 and FIG. 10 does not depend on whether the embodiment shown in FIG. 8 is implemented, and the embodiments may be implemented independently.

In this embodiment, the chip is provided. The chip includes the thread unit, the search engine unit, the TCAM unit, and the memory unit, where the TCAM unit is disposed in the search engine unit, or the TCAM unit is connected to the search engine unit. The thread unit sends the search instruction to the search engine unit, where the search instruction includes the data address, the first search field, and the search identifier, and the search identifier is used to identify the second search field. Then, the thread unit switches from the RUN state to the WAIT state. The search engine unit determines, according to the search instruction, the data indicated by the data address. In addition, the search engine unit generates the search keyword, and the search engine unit sends a branch search instruction to the TCAM unit to search for the program counter, where the branch search instruction includes the search keyword. Then, the search engine unit returns the determined data and program counter to the thread unit. After receiving the data and the program counter that are sent by the search engine unit, the thread unit switches from the WAIT state to the RUN state, and the thread unit executes an instruction corresponding to the program counter. In the foregoing process, because the thread unit needs to initiate only one search instruction to obtain the data and the program counter required by the thread unit, the thread unit switches from the RUN state to the WAIT state only once. To be specific, the thread unit needs to switch from the RUN state to the WAIT state only once, to complete data search and branch search. Therefore, this reduces a quantity of times the thread unit is switched to the WAIT state, and reduces a quantity of times an instruction processing process of the thread unit is interrupted, and the thread unit does not need to repeatedly perform an already performed step for a plurality of times. Therefore, the instruction processing process of the thread unit can be accelerated, instruction processing efficiency is improved, and core running efficiency of the chip and running efficiency of the chip are accelerated. In addition, the search engine unit determines a field that needs to be reserved in the data.

Figure 11:
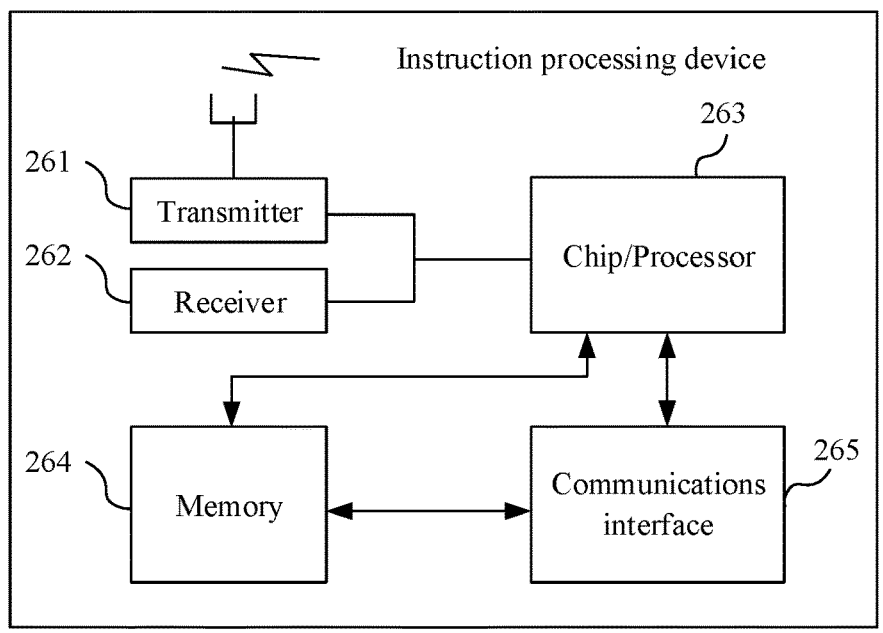
FIG. 11 is a schematic block diagram of an instruction processing device according to an embodiment of this application.

FIG. 11 is a schematic block diagram of an instruction processing device according to an embodiment of this application. As shown in FIG. 11, the instruction processing device includes a transmitter 261, a receiver 262, and a processor 263.

The processor 263 is configured to perform the steps in FIG. 4, or the processor 263 is configured to perform the steps in FIG. 5. The processor 263 is configured to implement the units and the modules in FIG. 8 to FIG. 10.

The processor 263 of the instruction processing device of the embodiment shown in FIG. 11 may be configured to execute the technical solutions of the foregoing method embodiments, or a program of the units and the modules of the embodiments shown in FIG. 8 to FIG. 10. The processor 263 invokes the program to perform operations of the foregoing method embodiments to implement the units and the modules shown in FIG. 8 to FIG. 10.

The processor 263 may be alternatively a chip, and is represented as a "chip/processor 263" in FIG. 11. The transmitter 261 and the receiver 262 are configured to: support the instruction processing device to send information to and receive information from each device in a network environment in the foregoing embodiments; and support the instruction processing device to communicate with each device in a network environment in the foregoing embodiments.

Further, the instruction processing device may further include a memory 264, where the memory 264 is configured to store program code and data of the instruction processing device. Further, the instruction processing device may further include a communications interface 265.

For example, the processor 263 is a chip or an NPCPU, or may be one or more integrated circuits configured to implement the foregoing methods, for example, one or more application-specific integrated circuits (ASIC), one or more microprocessors (digital signal processor, DSP), or one or more field programmable gate arrays (FPGA). The memory 264 may be a memory, or may be a collective name of a plurality of storage elements.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of this application are all or partially generated. The computer may be a general-purpose computer, a dedicated computer, a computer network, or other programmable apparatuses, e computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

A person skilled in the art should be aware that in the foregoing one or more examples, functions described in the embodiments of this application may be implemented by hardware, software, firmware, or any combination thereof. When the present invention is implemented by software, the foregoing functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a general-purpose or dedicated computer.

What is claimed is:

1. An instruction processing method, comprising:
   sending, by a thread processing circuit of a chip, a search instruction to a search engine processing circuit of the chip, wherein the search instruction comprises a data address and a first search field;
   determining, by the search engine processing circuit according to the search instruction, data indicated by the data address and a program counter indicated by the first search field, wherein the determining data indicated by the data address and a program counter indicated by the first search field comprises:
      determining, by the search engine processing circuit, the data based on the data address;
      determining, by the search engine processing circuit, a search keyword based on the data and the first search field; and
      performing at least one of the following:
         sending, by the search engine processing circuit, the search keyword and the data to a ternary content addressable memory (TCAM) processing circuit of the chip, wherein the TCAM processing circuit is disposed in the search engine processing circuit, and determining, by the TCAM processing circuit, the program counter based on the search keyword; or
         sending, by the search engine processing circuit, the search keyword and the data to the ternary content addressable memory (TCAM) processing circuit of the chip, wherein the TCAM processing circuit is connected to the search engine processing circuit, determining, by the TCAM processing circuit, the program counter based on the search keyword, and sending the program counter to the search engine processing circuit; and
   sending, by the search engine processing circuit, the data and the program counter to the thread processing circuit.

2. The method according to claim 1, wherein determining, by the search engine processing circuit, the data based on the data address comprises:
   sending, by the search engine processing circuit, the data address to a memory processing circuit of the chip;
   determining, by the memory processing circuit based on the data address, the data indicated by the data address; and
   sending, to the search engine processing circuit, the data indicated by the data address.

3. The method according to claim 1, wherein the search instruction further comprises a search identifier, the search identifier identifies a second search field, and wherein determining, by the search engine processing circuit, the search keyword based on the data and the first search field comprises:
   determining, by the search engine processing circuit, the second search field in the data based on the search identifier; and
   generating, by the search engine processing circuit, the search keyword based on the first search field and the second search field.

4. The method according to claim 3, wherein the search keyword comprises the first search field, a priority of the first search field, the second search field, and a priority of the second search field.

5. The method according to claim 1, wherein before sending, by the thread processing circuit, the search instruction to the search engine processing circuit, the method further comprises:
   obtaining, by the thread processing circuit, a packet, wherein the packet comprises a destination address of the data; and generating, by the thread processing circuit, the first search field based on the destination address of the data.

6. A chip, comprising:
a thread processing circuit;
a search engine processing circuit;
a ternary content addressable memory (TCAM) processing circuit
at least one processor; and
a non-transitory computer-readable storage medium coupled to the at least one processor and storing programming instructions for execution by the at least one processor, wherein the programming instructions instruct the at least one processor to cause:
the thread processing circuit to send a search instruction to the search engine processing circuit, wherein the search instruction comprises a data address and a first search field; and
the search engine processing circuit to:
determine, according to the search instruction, data indicated by the data address and a program counter indicated by the first search field; and
send the data and the program counter to the thread processing circuit; and wherein the TCAM processing circuit is disposed in the search engine processing circuit, the search engine processing circuit comprises a requester and a result processing circuit, and the requester is connected to the result processing circuit, an wherein the TCAM processing circuit comprises a receiver, a determiner, and a sender, and the receiver and the sender are separately connected to the determiner, and wherein the programming instructions further instruct the at least one processor to cause:
the requester to determine the data based on the data address;
the result processing circuit to obtain the data and determine a search keyword based on the data and the first search field;
the receiver to receive the search keyword and the data that are sent by the result processing circuit;
the determiner to determine the program counter based on the search keyword; and
the sender to send the data and the program counter to the thread processing circuit.

7. The chip according to claim 6, wherein the chip further comprises a memory processing circuit, and the memory processing circuit is separately connected to the requester and the result processing circuit, and wherein the programming instructions further instruct the at least one processor to cause:
the requester to send the data address to the memory processing circuit; and
the memory processing circuit to:
determine, based on the data address, the data indicated by the data address; and
send, to the result processing circuit, the data indicated by the data address.

8. The chip according to claim 6, wherein the search instruction further comprises a search identifier, and the search identifier identifies a second search field, and wherein the programming instructions further instruct the at least one processor to cause the result processing circuit to:
determine the second search field in the data based on the search identifier; and
generate the search keyword based on the first search field and the second search field.

9. The chip according to claim 8, wherein the search keyword comprises the first search field, a priority of the first search field, the second search field, and a priority of the second search field.

10. The chip according to claim 6, wherein the programming instructions further instruct the at least one processor to cause the thread processing circuit to:
obtain a packet before sending the search instruction to the search engine processing circuit, wherein the packet comprises a destination address of the data; and
generate the first search field based on the destination address of the data.

11. A chip, comprising:
a thread processing circuit;
a search engine processing circuit;
a ternary content addressable memory (TCAM) processing circuit;
at least one processor; and
a non-transitory computer-readable storage medium coupled to the at least one processor and storing programming instructions for execution by the at least one processor, wherein the programming instructions instruct the at least one processor to cause:
the thread processing circuit to send a search instruction to the search engine processing circuit, wherein the search instruction comprises a data address and a first search field; and
the search engine processing circuit to:
determine, according to the search instruction, data indicated by the data address and a program counter indicated by the first search field; and
send the data and the program counter to the thread processing circuit; and wherein the TCAM processing circuit is connected to the search engine processing circuit, wherein the search engine processing circuit comprises a requester and a result processing circuit, and the requester is connected to the result processing circuit, wherein the TCAM processing circuit comprises a receiver, a determiner, and a sender, and the receiver and the sender are separately connected to the determiner, and wherein the programming instructions further instruct the at least one processor to cause:
the requester to determine the data based on the data address;
the result processing circuit to obtain the data and determine a search keyword based on the data and the first search field;
the receiver to receive the search keyword sent by the result processing circuit;
the determiner to determine the program counter based on the search keyword;
the sender to send the program counter to the result processing circuit; and
the result processing circuit to send the data and the program counter to the thread processing circuit.

12. The chip according to claim 11, wherein the chip further comprises a memory processing circuit, and the memory processing circuit is separately connected to the requester and the result processing circuit, and wherein the programming instructions further instruct the at least one processor to cause:
the requester to send the data address to the memory processing circuit; and
the memory processing circuit to:
determine, based on the data address, the data indicated by the data address; and send, to the result processing circuit, the data indicated by the data address.

13. The chip according to claim 11, wherein the search instruction further comprises a search identifier, and the search identifier identifies a second search field, and wherein the programming instructions further instruct the at least one processor to cause the result processing circuit to:
   determine the second search field in the data based on the search identifier; and
   generate the search keyword based on the first search field and the second search field.

14. The chip according to claim 13, wherein the search keyword comprises the first search field, a priority of the first search field, the second search field, and a priority of the second search field.

15. The chip according to claim 11, wherein the programming instructions further instruct the at least one processor to cause the thread processing circuit to:
   obtain a packet before sending the search instruction to the search engine processing circuit, wherein the packet comprises a destination address of the data; and
   generate the first search field based on the destination address of the data.

\* \* \* \* \*

UNITED STATES PATENT AND TRADEMARK OFFICE
CERTIFICATE OF CORRECTION

PATENT NO. : 11,442,735 B2
APPLICATION NO. : 16/922457
DATED : September 13, 2022
INVENTOR(S) : Xing Tong and Hongliang Gao It is certified that error appears in the above-identified patent and that said Letters Patent is hereby corrected as shown below:

In the Claims

In Column 19, In Line 7 (Approx.), In Claim 6, delete "circuit" and insert -- circuit; --.

Signed and Sealed this
Second Day of May, 2023

Katherine Kelly Vidal
*Director of the United States Patent and Trademark Office*